(12) United States Patent
Iwasaki

(10) Patent No.: US 6,362,957 B1
(45) Date of Patent: *Mar. 26, 2002

(54) EXTERNAL STORAGE DEVICE

(75) Inventor: Hiroshi Iwasaki, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/658,456

(22) Filed: Sep. 8, 2000

Related U.S. Application Data

(62) Division of application No. 08/657,383, filed on Jun. 3, 1996, now Pat. No. 6,141,210, which is a division of application No. 08/205,451, filed on Mar. 4, 1994, now Pat. No. 5,550,709.

(30) Foreign Application Priority Data

Jul. 23, 1993 (JP) ............................................. 5-182650

(51) Int. Cl.[7] .................................................. H05K 7/10
(52) U.S. Cl. ........................ 361/684; 361/737; 361/748; 361/752; 235/439
(58) Field of Search ................................. 361/683–685, 361/733, 737, 754, 748, 752; 235/492; 439/160; 428/76

(56) References Cited

U.S. PATENT DOCUMENTS

| 4,264,917 A | 4/1981 | Ugon .......................... 257/668 |
| 4,943,464 A | 7/1990 | Gloton et al. ................. 428/76 |
| 5,027,190 A | 6/1991 | Haghiri-Tehrani et al.. . 257/679 |

(List continued on next page.)

FOREIGN PATENT DOCUMENTS

| EP | 0 214 478 | 3/1987 |
| EP | 0 228 278 A1 | 7/1987 |
| EP | 0 321 326 | 6/1989 |
| EP | 0 385 750 | 9/1990 |
| EP | 0 406 610 | 1/1991 |
| EP | 0 476 892 | 3/1992 |
| JP | 2-301155 | 12/1990 |
| JP | 3-2099 | 1/1991 |
| JP | 3-14192 | 1/1991 |
| JP | 3-114788 | 5/1991 |
| JP | 4-148999 | 5/1992 |
| JP | 5-17269 | 5/1993 |
| JP | 0 5120501 | 5/1993 |
| JP | 5-134820 | 6/1993 |

OTHER PUBLICATIONS

E. Harari, Nik kei Electronics, Feb. 17, 1992, pp. 155–168.
Pashley et al., "Flash Memories: The Best of Two Worlds," IEE Spectrum, Dec. 12/1989.
Kirisawa et al., "A Nand Structured Cell with a New Program ming Technology for Highly Reliable 5V–Only Flash EEPROM," IEEE Symposium on VLSI Technology, pp. 129–130.

*Primary Examiner*—Leo P. Picard
*Assistant Examiner*—Hung Van Duong
(74) *Attorney, Agent, or Firm*—Finnegan, Henderson, Farabow, Garrett & Dunner, L.L.P.

(57) ABSTRACT

An comprises an external storage device and an external storage device unit, wherein an external storage device main includes, a thin type external storage device module formed into a one-side sealed package from a storage medium series element containing at least one non-volatile semiconductor memory device, and a flat type external connection terminal connected to an input/output terminal of the storage medium series element and led and exposed to a backside of the external storage device module, and an external storage device unit includes, an external storage device main detachable section for engaging, insertedly attaching and detaching the external storage device main, an resilient contact electrically connecting to the external connection terminal of the external storage device main to be mounted, and at least a part of circuit function for driving and controlling the storage medium series element.

10 Claims, 4 Drawing Sheets

U.S. PATENT DOCUMENTS

| | | | |
|---|---|---|---|
| 5,061,845 A | 10/1991 | Pinnavaia | 235/492 |
| 5,079,673 A | 1/1992 | Kodai et al. | 361/783 |
| 5,153,818 A | 10/1992 | Mukougawa et al. | 361/737 |
| 5,155,663 A | 10/1992 | Harase | 361/395 |
| 5,276,317 A | 1/1994 | Ozouf et al. | 235/441 |
| 5,297,148 A | 3/1994 | Harari et al. | 365/185 |
| 5,299,089 A | 3/1994 | Lwee | 361/684 |
| 5,375,037 A | 12/1994 | LeRoux | 361/684 |
| 5,402,095 A | 3/1995 | Janniere | 235/441 |
| 5,428,569 A | 6/1995 | Kato et al. | 365/185 |
| 5,434,395 A | 7/1995 | Storck et al. | 235/380 |
| 5,508,971 A | 4/1996 | Cernea et al. | 365/185.23 |
| 5,509,018 A | 4/1996 | Niijima et al. | 714/710 |
| 5,526,233 A | 6/1996 | Hayakawa | 361/737 |
| 5,535,328 A | 7/1996 | Harari et al. | 714/7 |
| 5,563,825 A | 10/1996 | Cernea et al. | 365/185.18 |
| 5,568,424 A | 10/1996 | Cernea et al. | 365/185.23 |
| 5,592,420 A | 1/1997 | Cernea et al. | 365/185.18 |
| 5,596,532 A | 1/1997 | Cermea et al. | 365/185.18 |
| 5,602,987 A | 2/1997 | Harari et al. | 365/200 |
| 5,621,685 A | 4/1997 | Cernea et al. | 365/185.18 |
| 5,663,901 A | 9/1997 | Wallace et al. | 365/185.11 |
| 5,693,570 A | 12/1997 | Cernea et al. | 438/107 |
| 5,926,365 A * | 7/1999 | Roelofs et al. | 361/684 |

* cited by examiner

EXTERNAL STORAGE DEVICE

This is a division of application Ser. No. 08/657,383, filed Jun. 3, 1996, now U.S. Pat. No. 6,141,210, dated Oct. 31, 2000 which was a division of application Ser. No. 08/205,451, filed Mar. 4, 1994, now U.S. Pat. No. 5,550,709, dated Aug. 27, 1996, all of which are incorporated herein by reference.

BACKGROUND OF THE INVENTION

1. Field of the Invention

The invention relates to external storage devices with a thin thickness type that are releasably or exchangeably used for storage equipment and devices as an external storage medium.

2. Description of the Related Art

Two types of storage devices (memory elements), which are capable of recording and saving various data, have been utilized, namely, one is incorporated and fixed within storage equipment or devices, and the other is releasably or exchangeably incorporated in the storage equipment or devices. For the latter type, the external storage device, for example, floppy disks can freely be attached or detached by one touch operation. The floppy disks' being the storage mediums can separately be used depending on purpose and object. This therefore produces easier data reduction with optional classification, recording, and saving. However, a problem arises in the floppy disks described, where first, the data are occasionally disappeared on recording or saving the data to produce disadvantage in less reliability together with its slower access time. Next, when employing the smaller sized floppy disks in response to a miniaturization policy, a storing area of the storage medium is correspondingly smaller to reduce storage capacity, this thus gives an adverse effect in realizing the compact size and high capacity therefor. On the other hand, in semiconductor memory devices used as an external storage device such as IC memory cards there can largely solve the problems in the floppy disks such as less reliability on recording and saving the data and the slower access time. In general, the IC memory cards comprise, a functional circuit in which circuit components containing the semiconductor memory devices or elements are mounted on substrates, a resin case incorporating therein with the functional circuit as an inside attachment, a cover for covering and sealing an opening surface of the resin case, and external connection terminals such as two piece connectors which are attached on one edge of the resin case and electrically connect the functional circuit and the storage equipment/device.

However, the IC memory cards are assembled with a large amount of components and parts, where a relatively complicated structure is required with limitation to a thickness of the IC memory card, resulting in difficulty to realize compact size. Further, disadvantages arise in practical use because of lower cost performance or production yields on mass producing in addition to the less releasability or fluctuated releasability to the storage equipment and device.

SUMMARY OF THE INVENTION

An object of the invention is to provide an external storage device having a simplified structure with satisfactory production yields.

Another object of the invention is to provide an external storage device with a high reliability in view point of recording and saving the data.

Further another object of the invention is to provide an external storage device with a rapid access time.

Still another object of the invention is to provide an external storage device with high releasability for the storage equipment and device.

An external storage device according to the invention is comprised of an external storage device main and an external storage device unit, detail of which is as follows. An external storage device main includes, a thin type external storage device module formed into a one-sided sealed package from a storage medium series element containing at least one non-volatile semiconductor memory device, and a flat type external connection terminal connected to an input/output terminal of the storage medium series element and led and exposed to a backside of the external storage device module. An external storage device unit includes, a mechanism for engaging, insertedly attaching and detaching the external storage device main, an resilient contact electrically connecting to the flat type external connection terminal of the external storage device main.

In the external storage device according to the present invention, the external storage device main may preferably be formed into a one-sided sealed package structure. However for easier handling, the external storage device main may preferably be used in the form of a card type structure attached on the supporting plate. The external storage device unit may preferably be assembled and incorporated with a part or entire of the control circuit components or parts such as semiconductor elements constituting the control function.

The external storage device has a higher integration with a memory capacity to an extent of 16 M-bits per chip, in addition, is provided as a main memory with a non-volatile semiconductor memory device which does not require a power supply for maintaining storage. The main memory is formed into the one-sided sealed package to produce a thin type external storage device module or external storage device main. Thus, the external storage device module is easily achieved in a thin structure and at a lower cost by such as a transfer mold system. A mount of the external storage device main to the external storage device unit is performed by an insertion system at the side surface of the external storage device unit in the card type. The external connection terminal is led and placed in a manner of plane to the rear-side of the external storage device main, hence, a high reliable electrical connection can easily be performed even when attaching and detaching by a one touch system for the external storage device unit. In the card type, the external storage device itself maintains and exhibits satisfactory releasability for the storage equipment and devices. The card type external storage device main can readily be attached and detached for the external storage device unit, and realizes a function of the floppy disk device as it is, and simultaneously a reliability of electrical connecting and disconnecting due to the attaching and detaching can be improved.

DESCRIPTION OF THE PREFERRED EMBODIMENTS

The invention is described referring to FIGS. 1 to 9 as follows.

The present invention has been achieved by means of a cleverly conceived structure and profile where the devices such as semiconductor memory devices or elements are mounted on the conventional substrates and in accordance with the fact that a non-volatile semiconductor memory device or element with a capacity of 16 M-bits per chip corresponds to a 2 M-byte floppy disk.

Figure 1:
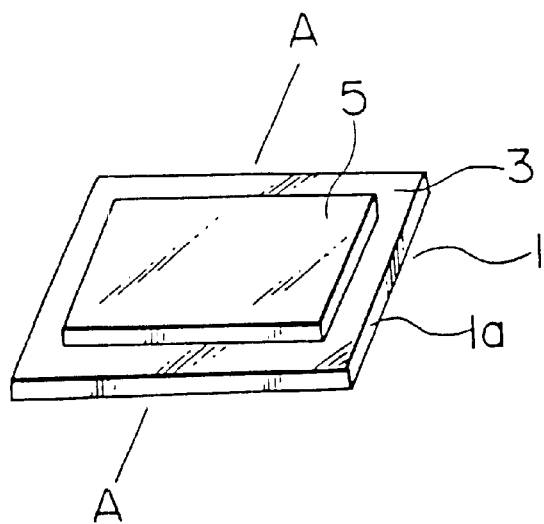
FIG. 1 is a top perspective view showing essentials of an example of an external storage device main according to the invention.
Figure 2:
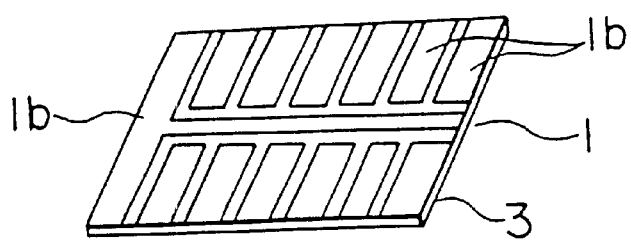
FIG. 2 is a bottom perspective view showing essentials of an example of an external storage device main according to the invention.
Figure 3:
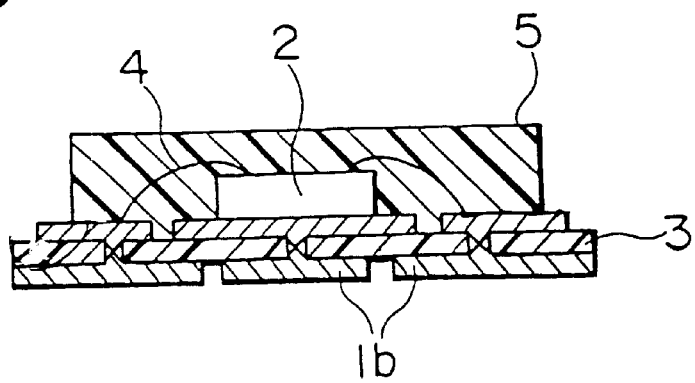
FIG. 3 is an enlarged sectional view taken along line A—A of FIG. 1 showing essentials of the example of the external storage device main according to the invention.

FIGS. 1 to 3 shows examples of an external storage device module constituting essentials of the thin type external storage device main according to the invention, where FIG. 1 is a perspective view on one-side surface which is one-sided sealed by a transfer mold, FIG. 2 a perspective view of rear-side surface which is one-side sealed by the transfer mold, and FIG. 3 is a sectional view taken along line A—A of FIG. 1.

In this example, a card type external storage device module 1a(1) is constituted in that a storage medium series element including a 16 M-bit NAND flash type non-volatile semiconductor memory device 2 is connected on surface of the so called through hole type resin based wiring substrate 3 by wire-bonding 4. The storage medium series element is, if required, allowed to include an anti-electrostatic element for preventing electrostatic destruction, the element being used for input and output of the non-volatile semiconductor memory device 2. Instead of the wire bonding 4, flip chip bonding may preferably be performed to directly adhere the memory element rear-side on the resin based wiring substrate 3, which is a thin wiring substrate, for example, using insulative substrate member made of glass-epoxy resin or the like. The resin based wiring substrate 3, a surface of which is mounted with the storage medium series element and includes the NAND flash type non-volatile semiconductor memory device 2, is one-side sealed by a transfer mold layer 5. More specifically, the external storage device module 1 (it sometimes becomes the external storage device main as it is) is sealed of its one-sided surface and formed into a flat plate shaped thin type package with an entire thickness of less than about 1 mm. The transfer mold layer 5 may generally be formed of epoxy based resin or the like, however, it may preferably be formed of composition containing inorganics.

On the other hand, the one-side sealed through hole type resin based wiring substrate 3, in other words, the backside surface of the external storage device module 1a(1) is arranged with a plane shaped or flat type terminal 1b taken out through the through hole to form the external storage device main 1. The plane shaped terminal 1b is gold (Au)-plated on its surface, and functions as an external connection terminal for electrically connecting to a contact member of an external storage device unit which is described later. In this example, the plane shaped terminal 1b is gold-plated to raise reliability of electrical connection, however, such plating is not always required.

Figure 4:
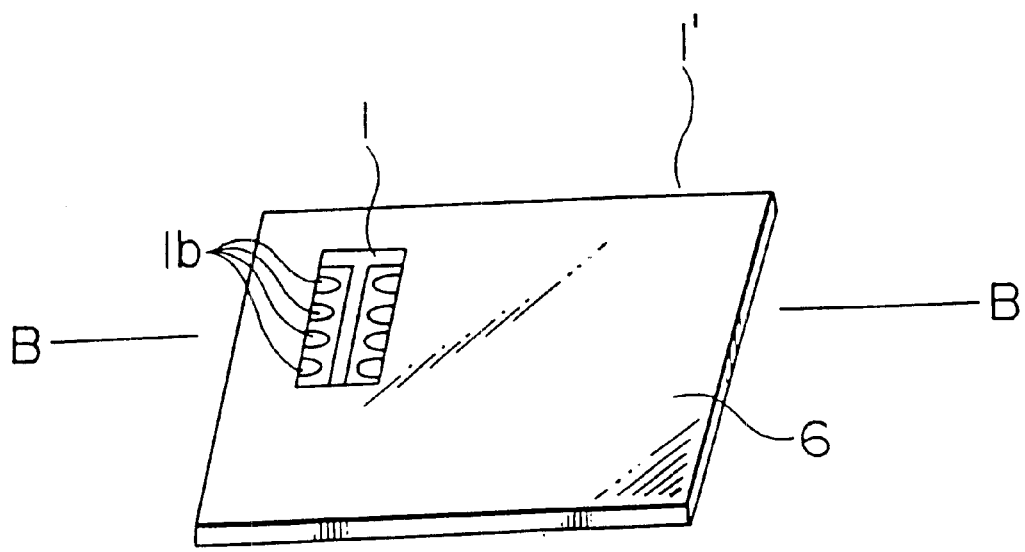
FIG. 4 is a top perspective view showing essentials of an example of another external storage device main according to the invention.
Figure 5:
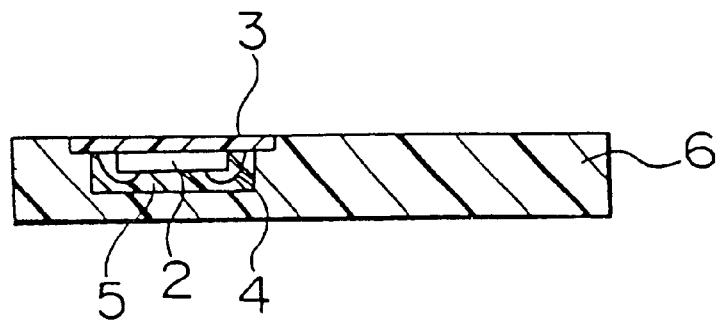
FIG. 5 is an enlarged sectional view taken along line B—B of FIG. 4 showing essentials of the example of the another external storage device main according to the invention.

FIGS. 4 and 5 shows a structural example of the card type external storage device main 1' in which the thin type external storage device module 1a(1) is attached on a card shaped supporter 6, where FIG. 4 is a perspective view, and FIG. 5 is a sectional view taken along line B—B of FIG. 4. The card shaped supporter 6 is, for example, an insulative resin plate.

In the example above, for a simplified operation the thin type external storage device module 1a(1) is incorporated into the card shaped supporter 6 sized of length 42.8 mm, width less than 27 mm, and thickness 0.76 mm each half the card size regulated in accordance with JEIDA. In more detail, the external storage device module 1a(1) is assembled into the card shaped supporter 6 having a recessed portion in which the external storage device module 1a(1) can previously be inserted and attached. In this assembling, a surface of the external connection terminal 1b of the external storage device module 1a(1) is inserted and attached in an exposed shape in a manner of forming the same plane as a main surface of the card shaped supporter 6, thereby forming the card type storage device main 1'.

Figure 6:
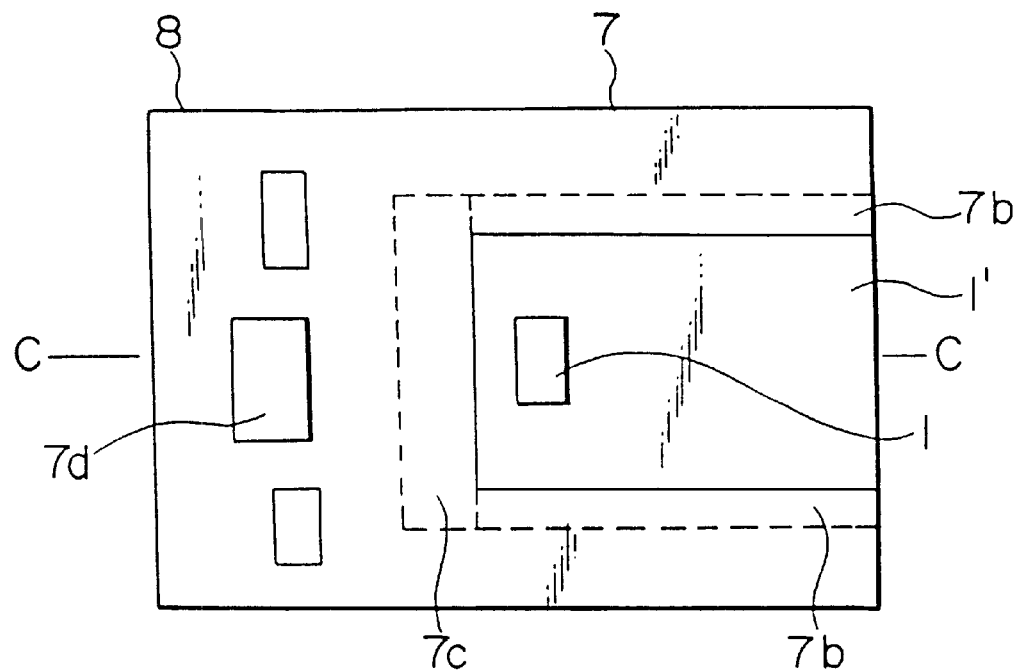
FIG. 6 is a plan view showing essentials of an example of an external storage device in which the external storage device main shown in FIG. 4 is assembled onto an external storage device unit.
Figure 7:
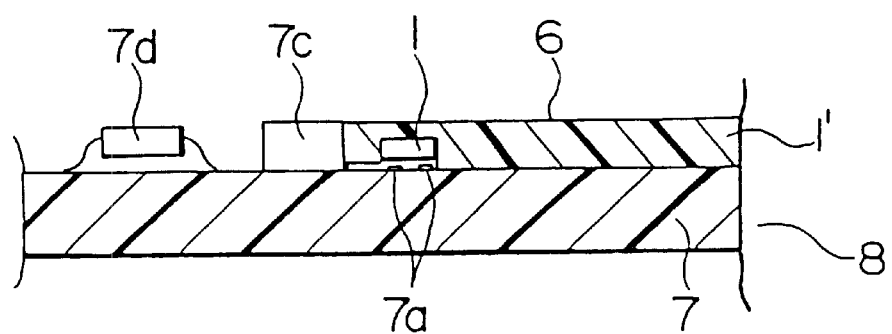
FIG. 7 is a sectional view taken along line C—C of FIG. 6.
Figure 8:
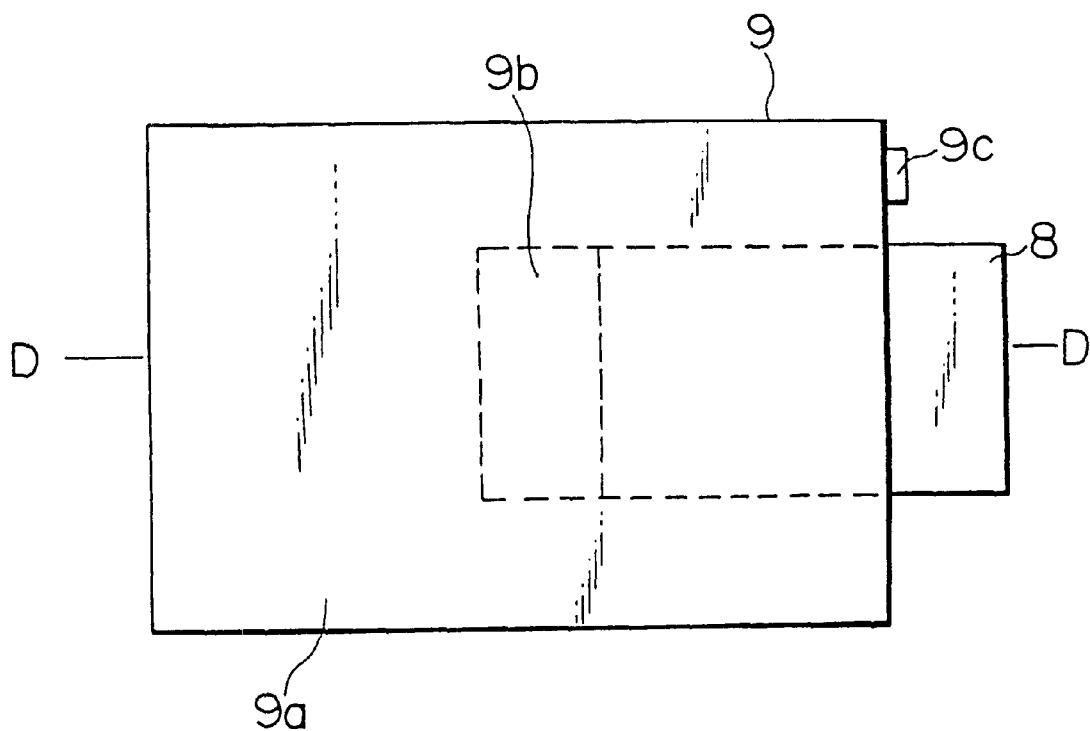
FIG. 8 is a plan view showing essentials of an example of another external storage device in which the external storage device main shown in FIG. 7 is assembled into an external storage device unit.
Figure 9:
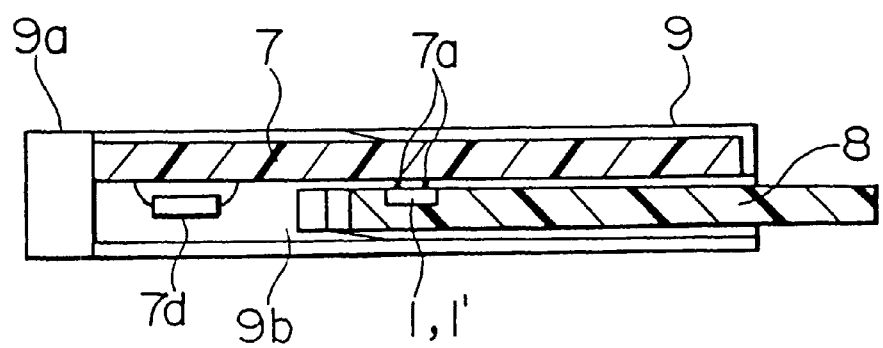
FIG. 9 is a sectional view taken along line D—D of FIG. 8.

FIGS. 6 and 7 shows a structural example wherein the card type external storage device main 1' is attached on the external storage device unit 7, where FIG. 6 is a plan view, and FIG. 7 is a sectional view taken along line C—C of FIG. 6.

In this example, the card type external storage device main 1' is a one-sided constituent element. The external storage device module 1a(1), in which the storage medium series element including at least the non-volatile semiconductor memory chip 2 is one-side sealed by the transfer mold, is inserted and attached into the card shaped supporter 6 to produce the card type external storage device main 1', which is premised on this example as described. The card type external storage device main 1' is releasably attached on and assembled into the external storage device unit main 7 to form an external storage device 8, where the external storage device unit main 7 can electrically be connected for the plane shaped external connection terminal 1b provided on the external storage device module 1a(1) on the card type external storage device main 1', and simultaneously the external storage device unit 7 has a structure that the card type external storage device main 1' is releasably attached.

The attaching structure for releasably attaching and detaching the card type external storage device main 1' is that the external storage device unit main 7 is provided on its surface with a recessed portion corresponding to shape and dimension of the card type external storage device main 1', a surface on the recessed portion is arranged with a contact 7a which is allowed to correspond to the external connection terminal 1b of the card type external storage device main 1'. To attach and detach the card type external storage device main 1' smoothly, a guide structure 7b and a one touch structure 7c are provided. When the card type external storage device main 1' is inserted, attached or removed in an arrow mark direction, then a smooth insertion and extraction is available by the guide structure 7b placed on side-surface of the insertion and extraction direction. Simultaneously, the one touch structure 7c placed on a tip end in the insertion direction provides the secure attaching and electrical connection or the releases thereof. If required, a micro-switch system for supplying electricity to the card type external storage device main 1' may preferable to be provided the one touch structure 7c. In FIGS. 6 and 7, 7d depicts an IC element group constituting a part of a drive and control circuit of the storage medium series elements including the non-volatile semiconductor memory chip 2 which the card type external storage device section 1' possesses. A contact 7a for electrically connecting to the external connection terminal 1b is made, for example, a pin type contact having a spring mechanism.

The external storage device 8 attached with the card type external storage device main 1' according to the invention is not limited to the example as described above. For example, the structure shown in a plan view of FIG. 8 and in a sectional view of FIG. 9 taken along line D—D of FIG. 8 may preferably be taken into the present invention. The card type external storage device main 1' may preferably be inserted or extracted from side-surface of a case 9 to be attached in the casing 9 provided on one side with a pin connection 9a, for example, a casing 9 sized of length 85.6 mm, width 54.0 mm, and thickness 3.3 mm. In more detail, the casing 9 is provided with an insertion and extraction section 9b such as space or gap for attaching through inserting and extracting the card type external storage device main 1' from the side-surface of the casing 9. A push button 9c may preferably be arranged previously on the casing 9 to achieve attaching or detaching to the external storage device unit 7. In particular, in structure where the card type external storage device main 1' is attached by inserting and extracting from the side surface of the external storage device unit main 7, compared to the structure having the surface recessed portion for attaching the card type external storage device main 1', it is correspondingly not required to enlarge an outer surface required for attaching the external storage device. Thus, this easily realizes a compact size, fine view, and high reliability due to incorporation (inside mount) of the card type external storage device main 1'.

It is understood that the present invention is not limited to the example as hereinbefore described. For example, the card type external storage device main according to the invention may be used, as it is, without attaching on the card shaped supporter 6.

As is apparent from the description above, the external storage device according to the present invention has a higher integration and provides even in one chip a larger memory capacity of non-volatile semiconductor memory device as a main memory. In addition, the basic construction is employed in that the external storage device main is attached with a compact structure where the main memory described is one-side sealed by transfer mold. The use of the one-side sealing system and the non-volatile semiconductor memory device simply provides a thin structure and compact size of the external storage device. A releasability on attaching and easiness on carrying provide simple operation and handling, and result in a lower cost. When forming the external storage device by combining with the external storage device unit, reliability in the card type external storage device can be improved preventing damage or connection failures of the external connection terminal with a graded releasability due to satisfactory slidability. In particular, a large amount of advantages in practical use are obtained, in optionally detaching or easily carrying the external storage device main without the possibility of outer damage, or in a larger capacity of recording or saving the data even in a compact size.

What is claimed is:

1. An external storage device for storing data, comprising:
   a storage device module including:
      a substrate having a first face and a second face, the first face having a first region and a second region, a wiring pattern formed on the first face which extends from the first region to the second region, and the substrate having at least one through hole;
      a semiconductor element consisting essentially of at least one NAND type non-volatile semiconductor memory device capable of being electrically written with data to be stored, the semiconductor element having an input/output terminal, and being mounted in the first region of the first face of the substrate, and the input/output terminal connected with the wiring pattern in the first region; a bonding wire electrically connecting the semiconductor element to the wiring pattern;
      a sealing resin formed only on the first region of the first face of the substrate to seal the semiconductor element, the sealing resin formed into substantially a rectangular shape, wherein edges of the sealing resin are parallel to corresponding edges of the substrate, respectively;
      a flat type external connection terminal formed on the second face of the substrate, and the flat type external connection terminal connected to the wiring pattern via the at least one through hole;
   a card shaped support having a recess for receiving the storage device module so that the second face of the substrate is exposed to a surface of the support.

2. The external storage device as claimed in claim 1, wherein the edges of the sealing resin do not overlap the edges of the substrate.

3. The external storage device as claimed in claim 2, wherein the storage device module is independent of a driving and controlling circuit.

4. The external storage device as claimed in one of claims 1 and 3, wherein the external storage device further comprises an anti-electrostatic element.

5. The external storage device as claimed in one of claims 1 and 3, wherein a surface of the flat type external connection terminal of the storage device module is coated with a gold plated layer.

6. The external storage device as claimed in one of claims 1 or 3, wherein the card shaped support has a thickness of less than approximately 1 mm.

7. The external storage device as claimed in one of claims 1 or 3, wherein the storage device module is placed in the recess of the support so that a surface of the flat type external connection terminal is substantially flush with the surface of the support.

8. The external storage device as claimed in claim one of claims 1 or 3, wherein the card shaped support has an area less than half of a card size area specified in JEIDA standards.

9. The external storage device as claimed in one of claims 1 and 3, wherein the recess of the card shaped support has a step, wherein the step and the second region of the substrate are opposed.

10. The external storage device as claimed in one of claims 1 and 3, wherein the NAND flash type non-volatile semiconductor memory device and the flat type external connection terminal are connected so that the data to be stored can be directly communicated therebetween.

* * * * *